(12) United States Patent
Andersson

(10) Patent No.: US 6,605,488 B1
(45) Date of Patent: Aug. 12, 2003

(54) LAYOUT TECHNIQUE FOR SEMICONDUCTOR PROCESSING USING STITCHING

(75) Inventor: Anders Andersson, Pasadena, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/687,266

(22) Filed: Oct. 12, 2000

Related U.S. Application Data

(60) Provisional application No. 60/159,134, filed on Oct. 12, 1999.

(51) Int. Cl.$^7$ .......................... H01L 21/00; H01L 31/00; G21K 1/00
(52) U.S. Cl. .......................... 438/57; 438/129; 257/448; 250/492.22
(58) Field of Search .............................. 716/7, 8, 9, 10, 716/11, 19; 438/129, 57; 250/492.22; 257/443, 448, 459

(56) References Cited

U.S. PATENT DOCUMENTS

| | | | | |
|---|---|---|---|---|
| 5,652,163 A | * | 7/1997 | Schinella et al. | 438/499 |
| 6,137,535 A | * | 10/2000 | Meyers | 348/340 |
| 6,225,013 B1 | * | 5/2001 | Cohen et al. | 430/30 |

OTHER PUBLICATIONS

Kirihata et al., "A 220–mm2, Four– and Eight–Bank, 256–Mb SDRAM with Single–Sided Stitched WL Architecture", IEEE Journal of Solid–State Circuits, vol. 33, No. 11, Nov. 1998, pp. 1711–1719.*

* cited by examiner

*Primary Examiner*—Evan Pert
(74) *Attorney, Agent, or Firm*—Dickstein Shapiro Morin & Oshinsky LLP

(57) ABSTRACT

A technique and structure for simplifying the stitching process is disclosed. According to one aspect of the present system, a floor plan that minimizes the number of blocks for a two-dimensional stitching project is described. Another technique describes a special layout method for a row/column decoder that reduces the number of blocks when stitching.

17 Claims, 5 Drawing Sheets

LAYOUT TECHNIQUE FOR SEMICONDUCTOR PROCESSING USING STITCHING

CROSS REFERENCE TO RELATED APPLICATION

This application claims the benefit of the priority of U.S. Provisional Application No. 60/159,134, filed on Oct. 12, 1999, and entitled "A Layout Technique for Row/Column Decoders to Reduce Number of Blocks When Using Stitching".

BACKGROUND

The present disclosure generally relates to image sensors, and more specifically, to layout techniques for image sensor components using stitching.

Many semiconductor-processing foundries have a maximum lithographic size that they may use to form a chip. A common limit, for example, is 20×20 mm². Making a chip larger than that maximum size may be carried out using stitching. Stitching forms different portions of the chip in different areas of the wafer. The different areas are then "stitched" together to form the overall chip.

Complicated chips may require a large number of stitches to form an entire circuit. The complexity of the chips may mean higher cost, lower throughput, and higher risk to produce the chip. For example, FIG. 1 shows a layout of a prior art system for the 2K×2K sensor 100. In the illustrated example, the sensor needs a total of 17 blocks on the reticle and needs to be stitched 24 times.

SUMMARY

The present system teaches a technique and structure for simplifying the stitching process. According to one aspect of the present system, a floor plan that minimizes the number of blocks for a two-dimensional stitching project is described. Another technique describes a special layout technique for row/column decoder that reduces the number of blocks when stitching.

BRIEF DESCRIPTION OF THE DRAWINGS

Different aspects of the disclosure will be described in reference to the accompanying drawings wherein.

DETAILED DESCRIPTION

The present disclosure describes a layout technique for stitching blocks to form large image sensors. These sensors are often larger than the typical reticle size of 20×20 mm², and thus, need to be stitched together using several blocks. The technique involves designing a floor plan that minimizes the number of blocks for a two-dimensional stitching project.

Figure 1:
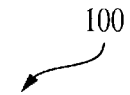
FIG. 1 shows a layout of a prior system using multiple blocks.
Figure 2:
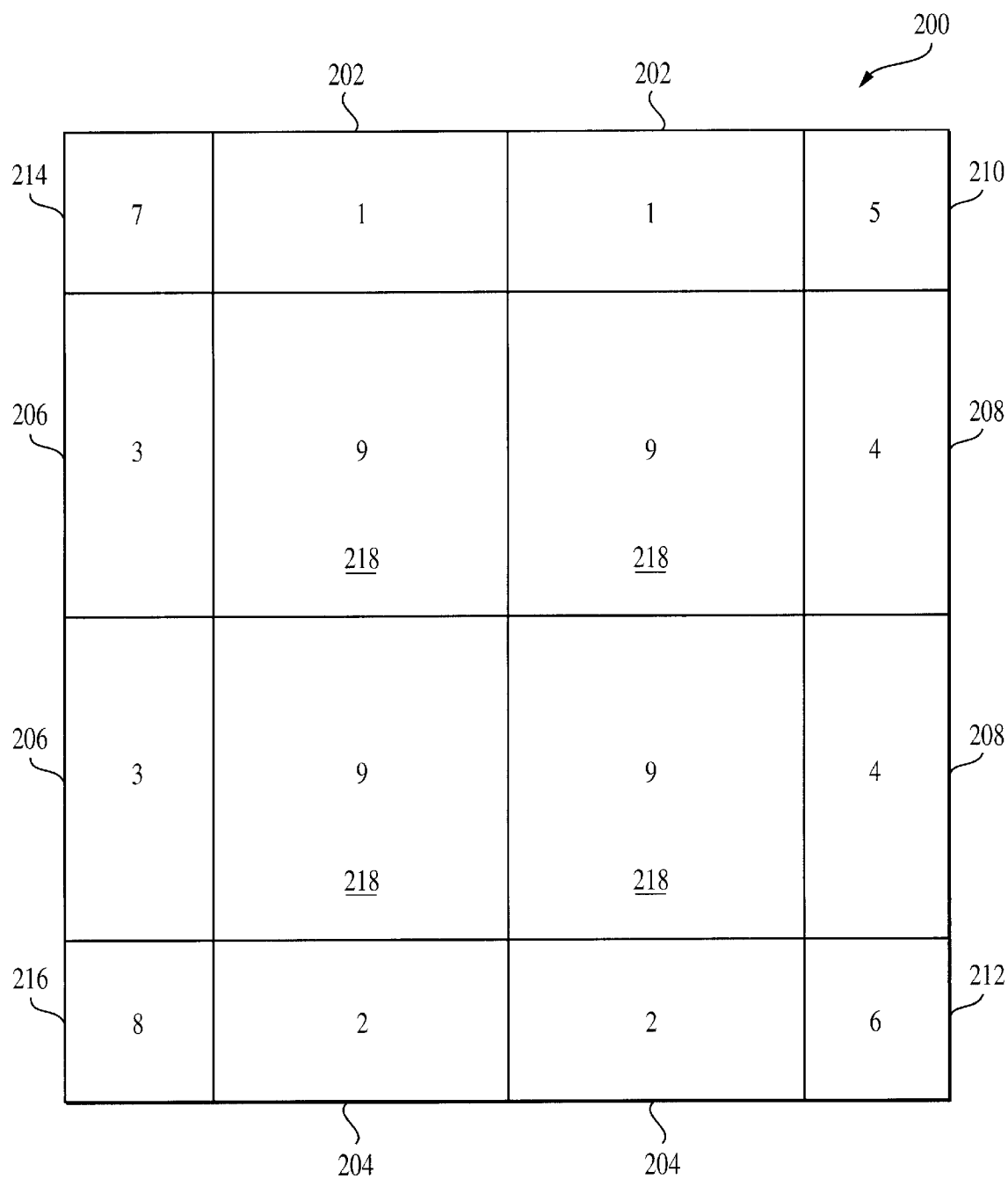
FIG. 2 shows a floor layout plan according to an embodiment of the present disclosure.

FIG. 2 shows one example of an improved layout technique for laying out a 2K×2K sensor 200 similar to the one 100 shown in FIG. 1. However in this illustrated embodiment, the sensor 200 is designed with only 9 blocks that are stitched only 16 times. This is one-third less stitching than in the layout technique used in FIG. 1.

The improved technique utilizes routing lines and repeatable blocks to make connections in the blocks that are used more than once. For example, the top 202 and bottom 204 blocks are each used twice. The blocks 202, 204 may include analog signal processors, readout registers, column decoders for the readout registers, and output lines. The analog signal processor and the readout registers may be repeated because they are same for each column. However, the column decoders are designed in an interleaving pattern so that the block 202, 204 may be repeated and stitched. The interleaving pattern design is further described below.

The left side block 206, which may be used twice, may include row decoders and input lines. The row decoders are also designed in an interleaving pattern as described below. The right side blocks 208, which are also used twice, may include analog pads and routing lines.

The right corner blocks 210, 212 may include unique pad and connections. The left corner blocks 214, 216 may include digital block, unique pads, drivers, and connections. The middle blocks 218, which are used four times, include pixel arrays.

In the above example, the number of blocks that needs to be patterned on a reticle is reduced to 15 mm×17 mm by using repeatable blocks. This allows the above-described sensor 200 to be designed on a single reticle.

One common problem in a row/column decoder is the need for each portion of the decoder to have a different configuration. This may cause highly complex circuits and arrangements.

According to the present system, instead of dividing the row/column decoder into different blocks, a generic block is formed that uses interleaving to form the whole row/column decoder. The interleaving is made between generic blocks and effectively turns each generic block into a separate block.

Figure 3:
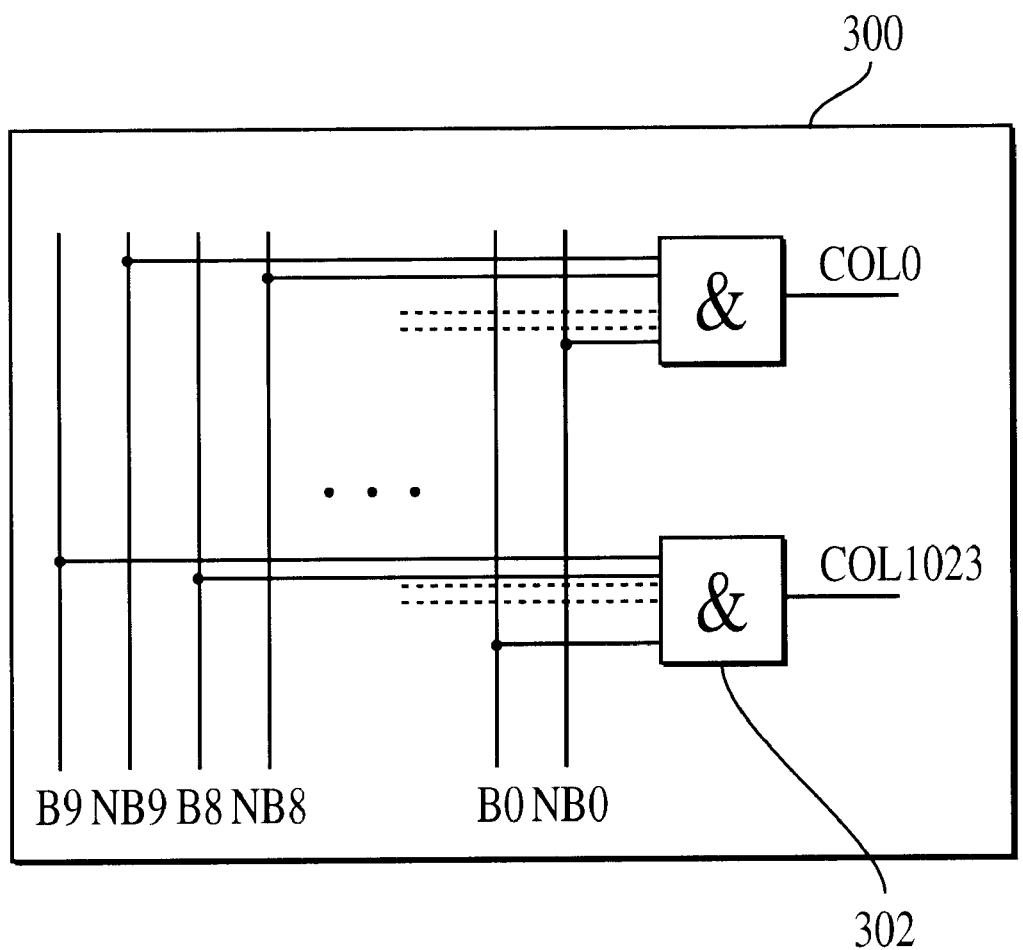
FIG. 3 shows a basic block diagram of a column decoder.
Figure 4:
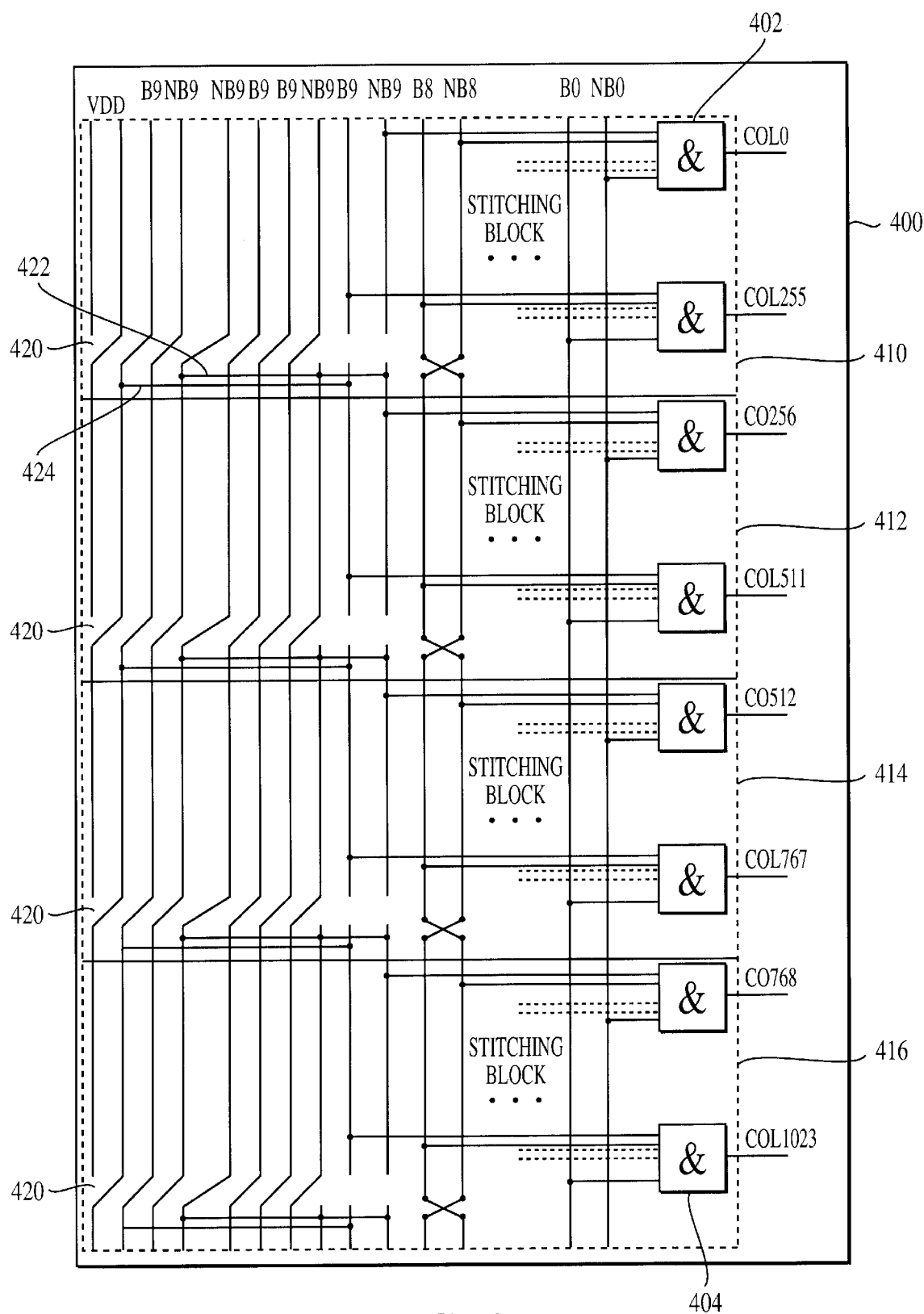
FIG. 4 shows a schematic of the stitching block embodying the column decoder.

An example is described with reference to FIGS. 3 and 4. In the illustrated example, a column decoder chip 300 may use 1024 column decoders 302 with 25 μm pitch. The reticle size being used (typically 20×20 mm²) requires that this block be divided into four different pieces. According to the present system, instead of dividing the block in this way, a single generic block is used four times. This saves area on the reticle.

In order to do this, a generic block is formed which has 256 column decoders. This block is stitched together four times. The generic column decoder 400 is shown in FIG. 4. The column decoders numbered from 0 (column decoder 402) to 1023 (column decoder 404) are addressed by the lines shown as NB0–B9. This will be divided according to the present system into one block of 256 that gets used four times. FIG. 4 shows the four generic blocks 410, 412, 414, 416 stitched together.

When the generic blocks 410, 412, 414, 416 are connected, the lines cannot simply be stitched together because that would select four columns for each value of B9-B0. The present system uses interleaving of the lines to stitch the connections between the blocks 410, 412, 414, 416. To do this, 6 more lines are added to the address lines B9-B0. Two extra lines may be added to make sure that no line is floating. Each added line shifts down one line 420 before moving to the next block as shown. Further, lines NB8 and B8 are switched or interleaved between each block. Added line 4 and NB9 are connected together as shown 422.

Added line 1 may also be connected to those two lines to make sure that there are no floating lines. Added line 6 and B9 are also connected 424 in the generic block.

This shifting and interleaving allows the alternate addressing of the columns using the generic design. Therefore, all 1024 decoders may be addressed by stitching together four generic blocks 410, 412, 414, 416, each having 256 decoders. Similar design may be used in the row decoder to provide alternate addressing of the rows.

Care must be taken in stitching blocks that are not multiples of 2. For those blocks, a counter must be adjusted to fit the structure. For example, for a block having 129 column decoders in one block, a counter must be configured to run from 0 to 128 and then jump to 256 to 384, and so on.

Figure 5:
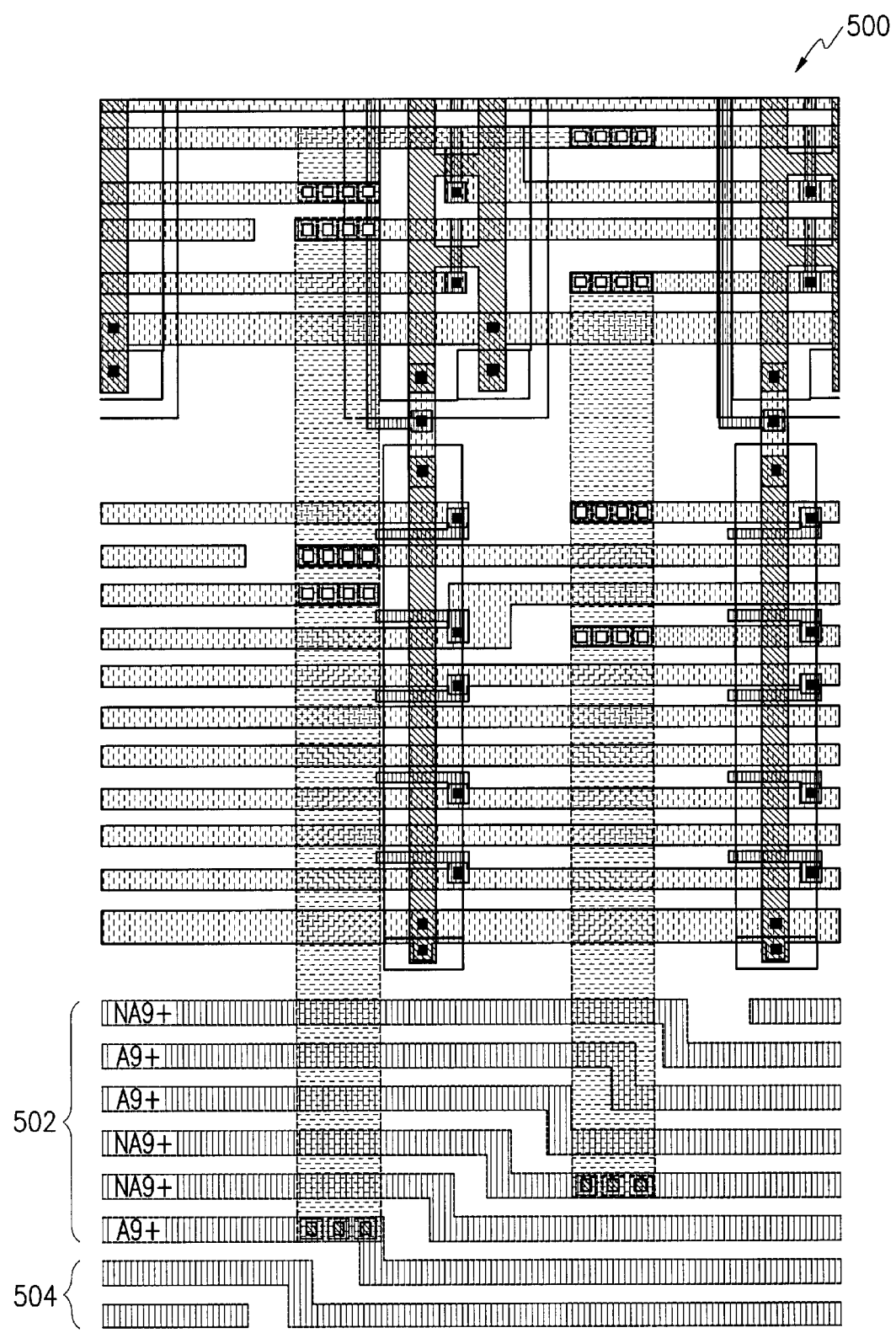
FIG. 5 shows a layout of the stitched chip.

FIG. 5 shows a mask layout 500 of the stitched chip according to the above-described embodiments. The layout 500 also shows the six added address lines 502 and two extra lines 504.

While specific embodiments of the invention have been illustrated and described, other embodiments and variations are possible.

All these are intended to be encompassed by the following claims.

What is claimed is:

1. A method comprising:
   generically designing circuit blocks required on a reticle to pattern an image sensor;
   providing said circuit blocks on said reticle;
   repeatedly exposing said circuit blocks on said reticle onto a die so that circuit portions of the image sensor are patterned onto the die, the circuit blocks including at least one repeatable block;
   exposing the at least one repeatable block at least two times onto the die to form sub-blocks;
   appropriately stitching said sub-blocks to form combined blocks that operate properly as designed;
   interleaving address lines between sub-blocks to form row and column decoders; and
   forming address lines including at least one extra address line, to alternately address different blocks of said row and column decoders.

2. The method of claim 1, wherein said generically designing includes shifting at least one of the address lines.

3. The method of claim 2, wherein said generically designing also includes cross-coupling two of the address lines.

4. A photolithographic system comprising:
   a reticle having generically designed circuit blocks, said circuit blocks disposed on a reticle to be patterned as an image sensor, at least one of said circuit blocks being a repeatable block;
   a light beam source; and
   a die having a pattern of said image sensor formed on a surface of said die, said pattern formed by exposing said generically designed circuit blocks on said reticle to said light beam source, the repeatable block being exposed to said light beam source at least two times to form multiple blocks of the pattern on the die surface, and stitching the pattern blocks together, said stitching including interleaving connection lines between pattern blocks of row and column decoders.

5. The system of claim 4, wherein each of said row and column decoders includes extra address lines to alternately address different blocks of said row and column decoders.

6. The system of claim 5, wherein each of said row and column decoders includes shifted address lines.

7. The system of claim 6, wherein each of said row and column decoders includes a crossed pair of the connection lines.

8. A device comprising:
   a semiconductor die having a pattern of an image sensor formed thereon, the image sensor pattern including at least two repeatable blocks interconnected with interleaved connection lines to form a greater block, the greater block selected from the group consisting of a row decoder and a column decoder row decoder.

9. The device of claim 8 wherein the repeatable blocks include additional address lines to individually address the repeatable blocks within the greater block.

10. The device of claim 8 wherein the repeatable blocks include shifted address lines.

11. The device of claim 9 wherein two of the additional address lines in the repeatable blocks are crossed.

12. The device of claim 8 wherein the image sensor pattern includes an odd number of the repeatable blocks; and
    each of the repeatable blocks further include a counter.

13. A method comprising:
    providing a semiconductor die;
    providing a reticle having a repeatable block thereon;
    repeatedly directing a light source at the repeatable block to form at least two repeatable pattern blocks on the semiconductor die corresponding to the repeatable block;
    stitching the repeatable pattern blocks together, including interleaving connection lines between the repeatable pattern blocks; and
    forming circuit blocks of row and column decoders from the repeatable pattern blocks.

14. The method of claim 13 wherein interleaving includes interconnecting the circuit blocks of row and column decoders.

15. The method of claim 13 further including forming extra address lines in the repeatable block patterns to address different circuit blocks of the row and column decoders.

16. The method of claim 15 wherein said forming includes shifting a portion of the extra address lines so that the repeatable pattern blocks are individually addressable.

17. The method of claim 15 wherein forming includes crossing a pair of the connection lines.

* * * * *